(12) United States Patent
Bilionis et al.

(10) Patent No.: US 8,149,066 B2
(45) Date of Patent: Apr. 3, 2012

(54) INTEGRATED CIRCUIT DISTRIBUTED OSCILLATOR

(75) Inventors: George P. Bilionis, Pyrgos (GR); Alexios N. Birbas, Patras (GR); Michael K. Birbas, Patras (GR); John C. Kikidis, Patras (GR)

(73) Assignee: Analogies, Inc., Patra (GR)

( * ) Notice: Subject to any disclaimer, the term of this patent is extended or adjusted under 35 U.S.C. 154(b) by 0 days.

(21) Appl. No.: 11/964,192

(22) Filed: Dec. 26, 2007

(65) Prior Publication Data
US 2009/0072916 A1 Mar. 19, 2009

(30) Foreign Application Priority Data

Dec. 27, 2006 (GR) .............................. 20060100706

(51) Int. Cl.
*H03B 5/18* (2006.01)
*H03B 7/12* (2006.01)
(52) U.S. Cl. ....... 331/99; 331/96; 331/100; 331/107 SL; 331/107 DP
(58) Field of Classification Search .................... 331/96, 331/99, 100, 107 SL, 107 DP
See application file for complete search history.

(56) References Cited

U.S. PATENT DOCUMENTS

| | | | | |
|---|---|---|---|---|
| 4,619,001 A * | 10/1986 | Kane | ........................... | 455/192.3 |
| 5,365,197 A | 11/1994 | Ikalainen | | |
| 6,396,359 B1 | 5/2002 | Hajimiri et al. | | |
| 6,853,260 B1 * | 2/2005 | Hajimiri et al. | .................. | 331/96 |
| 7,307,483 B2 * | 12/2007 | Tzartzanis et al. | ............... | 331/57 |
| 7,398,054 B2 | 7/2008 | Tsirline et al. | | |
| 7,456,670 B2 * | 11/2008 | Mahanavelu et al. | ......... | 327/261 |
| 7,515,775 B1 * | 4/2009 | Kucharski et al. | ................ | 385/1 |
| 2004/0263227 A1 | 12/2004 | Baker et al. | | |
| 2005/0093637 A1 * | 5/2005 | Hajimiri et al. | ......... | 331/107 DP |
| 2006/0038623 A1 | 2/2006 | Yoon et al. | | |
| 2008/0030285 A1 * | 2/2008 | Gurov | ........................... | 333/104 |
| 2008/0054966 A1 * | 3/2008 | Tamura | ........................ | 327/158 |

FOREIGN PATENT DOCUMENTS

GB 460562 1/1937

OTHER PUBLICATIONS

B. Razavi; *Design of Analog CMOS Integrated Circuits*; Int. Ed.; 2001; pp. 515-518; McGraw Hill, New York.

(Continued)

*Primary Examiner* — Arnold Kinkead
*Assistant Examiner* — Richard Tan
(74) *Attorney, Agent, or Firm* — George C. Pappas

(57) ABSTRACT

An integrated circuit distributed radio frequency oscillator comprises a semiconductor chip which includes a differential input transmission line, a differential output transmission line and, coupled in parallel between these transmission lines at spaced apart portions, a number of differential amplifier cells with adjustable delay. The output end of the output transmission line is coupled back to the input end of the input transmission line by a feedback link with a pair of on-chip capacitors. The delay introduced by the amplifier cells is variable in response to a tuning voltage applied to a differential tuning input, making the oscillator suitable for use as a distributed VCO in, e.g. a phase-locked loop circuit. The layout of the oscillator on a semiconductor chip includes the series-connected arrangement of the differential transmission lines in a rectilinear spiral path.

9 Claims, 5 Drawing Sheets

OTHER PUBLICATIONS

D. Guckenberger, K. T. Kornegay; *Design of a Differential Distributed Amplifier and Oscillator Using Close-Packed Interleaved Transmission Lines*; IEEE Journal of Solid-State Circuits; Oct. 2005; pp. 1997-2007; vol. 40, No. 10.

D. Guckenberger, K. T. Kornegay; *Differential Distributed Amplifier and Oscillator in SiGe BiCMOS using Close-Packed Interleaved On-Chip Transmission Lines*; IEEE BCTM 3.3; 2004; pp. 68-71.

H. Wu, A. Hajimiri *Silicon-Based Distributed Voltage-Controlled Oscillators*; IEEE Journal of Solid-State Circuits; Mar. 2001; pp. 493-502; vol. 36, No. 3.

B. Kleveland, C.H. Diaz, D. Vook, L. Madden, T.H. Lee, S. S. Wong; *Monolithic CMOS Distributed Amplifier and Oscillator*; IEEE International Solid-State Circuits Conference; Feb. 1999; pp. 70-71.

T.Y.K Wong, A.P. Freundorfer, B.C. Beggs, J.E. Sitch; *A 10 Gb/s AlGaAs/GaAs HBT High Power Fully Differential Limiting Distributed Amplifier for III-V Mach-Zehnder Modulator*; IEEE Journal of Solid-State Circuits; Oct. 1996; pp. 1388-1393; vol. 31, No. 10.

S. Kimura, J, Imai, Y. Miyamoto; *Direct-Coupled Distributed Baseband Amplifier IC's for 40-Gb/s Optical Communication*; IEEE Journal of Solid-State Circuits; Oct. 1996; pp. 1374-1379; vol. 31, No. 10.

H. Suzuki, K. Watanabe, K. Ishikawa, H. Masuda, K. Ouchi, T. Tanoue, R. Takeyari; *Very-High-Speed InP/InGaAs HBT IC's for Optical Transmission Systems*; IEEE Journal of Solid-State Circuits; Sep. 1998; pp. 1313-1320; vol. 30, No. 9.

H. Shigematsu, M. Sato, T. Hirose, Y. Watanabe; *A 54-GHz Distributed Amplifier With 6-$V_{pp}$ Output for a 40-Gb/s LiNbO$_3$ Modulator Driver*; IEEE Journal of Solid-State Circuits; Sep. 2002; pp. 1100-1105; vol. 37, No. 9.

H-T Ahn, D.J. Allstot; *A 0.5-8.5-GHz Fully Differential CMOS Distributed Amplifier*; IEEE Journal of Solid-State Circuits; Aug. 2002; pp. 985-993; vol. 37, No. 8.

Y. Baeyens, et al.; *InP D-HBT ICs for 40-Gb/s and Higher Bitrate Lightwave Transceivers*; IEEE Journal of Solid-State Circuits; Sep. 2002; pp. 1152-1159; vol. 37, No. 9.

S.M. Ballweber, R. Gupta, D.J. Allstot; *A Fully Integrated 0.5-5.5-GHz CMOS Distributed Amplifier*; IEEE Transaction on Solid-State Circuits; Feb. 2000; pp. 231-239; vol. 35, No. 2.

S. Masuda, T. Takahashi, K. Joshin; *An Over-110-GHz InP HEMT Flip-Chip Distributed Baseband Amplifier with Inverted Microstrip Line Structure for Optical Transmission System*; Sep. 2003; pp. 1479-1484; vol. 38, No. 9.

R-C. Liu, C-S. Lin, K-L. Deng, H. Wang; *Design and Analysis of DC-to-14-GHz and 22-GHz CMOS Cascode Distributed Amplifiers*; IEEE Journal of Solid-State Circuits; Aug. 2004; pp. 1370-1374; vol. 39, No. 8.

W. R. Eisenstadt, Y. Eo; *S-Parameter-Based IC Interconnect Transmission Line Characterization*; IEEE Transactions on Components, Hybrids and Manufacturing Technology; Aug. 1992; pp. 483-490; vol. 15, No. 4.

V.K. Tripathi; *Asymmetric Coupled Transmission Lines in an Inhomogeneous Medium*; IEEE Transactions on Microwave Theory and Techniques; Sep. 1975; pp. 734-739; vol. MTT-23, No. 9.

D. Goren et al.; *On-chip Interconnect-Aware Design and Modeling Methodology, Based on High Bandwidth Transmission Line Devices*; Proceedings IEEE Design Automation Conference, Anaheim, California; Jun. 2003; pp. 724-727.

A. Hajimiri; *Distributed Integrated Circuits: An Alternative Approach to High-Frequency Design*; IEEE Communications Magazine; Feb. 2002; pp. 168-173; vol. 40, No. 2.

Y. Baeyens et al.; *High Gain-Bandwidth Differential Distributed InP D-HBT Driver Amplifiers with Large (11.3 $V_{pp}$) Output Swing at 40 Gb/s*; IEEE Journal of Solid-State Circuits; Oct. 2004; pp. 1697-1705; vol. 39, No. 10.

H-M. Rein, M. Möller; *Design Considerations for Very-High-Speed Si-Bipolar IC's Operating up to 50 Gb/s*; IEEE Journal of Solid-State Circuits; Aug. 1996; pp. 1076-1090; vol. 31, No. 5.

D.E. Bockelman, W.R. Eisenstadt; *Combined Differential and Common-Mode Scattering Parameters: Theory and Simulation*; IEEE Transactions on Microwave Theory and Techniques; Jul. 1995; pp. 1530-1539; vol. 43, No. 7.

A.W. Buckwald et al., *A 6-GHz Integrated Phase-Locked Loop Using AlGaAs/GclAs Heterojunction Bipolar Transistors*; IEEE Journal of Solid-State Circuits; Dec. 1992; pp. 1752-1762; vol. 27, No. 12.

J.N. Burghartz et al.; *Integrated RF Components in a SiGe Bipolar Technology*; IEEE Journal of Solid-State Circuits; Sep. 1997; pp. 1440-1445; vol. 32, No. 9.

A. Hajimiri, H. Wu; *Analysis and Design of Silicon Bipolar Distributed Oscillators*; 2000 Symposium on VLSI Circuits Digest of Technical Papers; Jun. 2000; pp. 102-105; XP-001242460.

J.D. Cressler, G. Niu; *Silicon-Germanium Heterojunction Bipolar Transistors*; 2003; pp. 22-25; Artech House, Norwood, MA.

I. Bahl; *Lumped Elements for RF and Microwave Circuits*; 2003; pp. 58-85; Artech House, Norwood, MA.

A. Iqbal, I.Z. Darwazeh; *Analytical Expression for the Equivalent Input Noise Current Spectral Density of HBT Distributed Amplifier Based Optical Receivers*; IEEE Optoelectron. Interfacing at Microw. Freq. Colloq; Apr. 1999; pp. 2/1-2/10; Ref. 1995/045.

A. Iqbal, I.Z. Darwazeh; *Transimpedance Gain Modelling of Optical Receivers Employing a Pin Photodiode and HBT Distributed Amplifier Combination*; IEEE Optoelectron. Interfacing at Microw. Freq. Colloq; Apr. 1999; pp. 3/1-3/9; Ref. 1999/045.

P.R. Gray, P.J. Hurst, S.H. Lewis, R.G. Meyer; *Analysis and Design of Analog Integrated Circuits*; 2001; pp. 224-230; 4th Ed. New York: Wiley.

G. Gonzales; *Microwave Transistor Amplifiers-Analysis and Design*; 1997; pp. 20-22; 2nd Ed. Englewood Cliffs, NJ: Prentice-Hall.

J.D. Cressler, G. Niu; *Silicon Germanium Heterojunction Bipolar Transistors*; 2003; pp. 139-183 (Chapter 5); Artech House, Norwood, MA.

G. Gonzalez; *Microwave Transistor Amplifiers Analysis and Design*; 1997; pp. 384-386; 2nd Ed. Englewood Cliffs, NJ: Prentice Hall.

\* cited by examiner

INTEGRATED CIRCUIT DISTRIBUTED OSCILLATOR

This invention relates to an integrated circuit distributed oscillator and, in particular, to a distributed radio frequency (RF) oscillator having differential input and output transmission lines which are interconnected.

Optical telecommunications, satellite telecommunications and microwave wireless links require the use of RF analogue circuits such as lumped amplifier circuits and, especially, voltage-controlled oscillator circuits operating at very high frequencies, e.g. upwards of 1 GHz or 10 GHz. Such circuits form the core of these systems. For the implementation of such circuits, advanced semiconductor technologies using group III/group V semiconductor compound devices or advanced silicon devices are preferred.

Group III/group V semiconductor structures, although achieving high performance with respect to speed and frequency, suffer from high production cost, low yield, and low integration capability. As a result, application costs are high, and development times are long.

Advanced silicon technologies, such as 90 nm RF CMOS or 0.13 μm SiGe BiCMOS offer lower costs and large scale integration, but suffer from poor performance at the high frequencies mentioned above when compared with the corresponding devices using III/V semiconductor compounds. The reasons for this reduced performance are the lower quality of the passive components (inductors, resistors, capacitors) used for the above-mentioned implementations, the lower quality of interconnects, as well as the existence of effects such as substrate coupling. According to ITRS 2005 (International Technology Roadmap for Semiconductors Report 2005) the further shrinking of circuit structures based on silicon technologies, as well as the proposed solutions for the interconnections problem, do not seem capable of bringing the desired improvement in these implementations. Furthermore, the use of nanotechnology is not foreseen to become feasible in economic terms in the near future.

It is known to use distributed circuits in the frequency regions referred to above. The ability of these circuits to absorb the parasitic capacitances of input and output stages, along with the linear signal superposition effect, are characteristics that allow the specific distributed circuits to offer a higher gain-bandwidth product compared to lumped implementations, see A. Hajimiri, "Distributed Integrated Circuits: An Alternative Approach to High-Frequency Design," Invited Paper, IEEE Communications Magazine, vol. 40, no. 2, pp. 168-173, February 2002.

The first distributed circuit and the associated theory was presented by W. S. Percival in 1937, see British Patent No. 460,562. This disclosed a microwave amplifier based on vacuum tubes or valves. Such valve circuits were widely used in CW radars after World War II, and were the forerunners of existing distributed circuit RF front-ends for microwave links and satellite systems, and laser drivers.

The majority of such systems have been implemented either with printed circuit boards or with advanced III/V semiconductor structures. The cost of the circuits is high and in, the case of semiconductor structure, occupies significant chip area with respect to the operation performed. Since the mid 1990s a number of research groups, universities and companies have developed distributed circuits (amplifiers and oscillators) in silicon technologies, targeting cost and monolithic implementation. It is worth noting that these implementations are mostly of a proof-of-concept nature rather than being real products in an integrated form.

In the case of distributed amplifiers, several implementations have been proposed in the literature, with the most representative ones being those of Yves Baeyens, Nils Weimann et al. "High gain-bandwidth differential distributed InP D-HBT driver amplifiers with large (11.3Vpp) output swing at 40 Gb/s", IEEE Journal of Solid-State Circuits, vol. 39, pp. 1697-1705, October 2004, and Hee-Tae Ann and Allstot "A 0.5-8.5 GHz fully differential CMOS distributed amplifier", IEEE Journal of Solid-State Circuits, vol. 37, pp. 985-993, August 2002. The former publication teaches a laser driver for 40 Gbits/sec optical communications using GaAs—InP HBTs (D-HBTs), while the latter describes a fully distributed differential amplifier with constant group delay in a bandwidth of 8.5 GHz with the use of 0.6 μm CMOS technology.

As far as distributed oscillators are concerned, there are minimal examples in the literature. The most representative ones include that described by H. Wu and A. Hajimiri, "Silicon-Based Distributed Voltage-Controlled Oscillators", IEEE J. Solid State Circ., 36 (2001) pp. 493-502. This analyses the design of a distributed oscillator with single-ended architecture in CMOS and BiCMOS technologies. Furthermore, a frequency tuning technique is presented and analyzed, known as "current steering" tuning. This mechanism is based on adjusting round trip delay to produce a corresponding frequency change. Specifically, two approaches to frequency tuning are presented: changing phase velocity in a loaded transmission line and changing the effective lengths of the transmission lines. The oscillation frequency is 12 GHz using BJT technology and 10 GHz using CMOS technology. This oscillator has a large coupling capacitance between the input terminals and output of the circuit.

In D. Guckenberger and K. T. Kornegay, "Design of a differential distributed amplifier and oscillator using close-packed interleaved transmission lines", *IEEE J. Solid-State Circuits*, vol. 40, pp. 1997-2007, October 2005, a differential distributed oscillator is described using 0.13 μm SiGe BiCMOS technology. This circuit has a connection between its input and output of the circuit using bond wires. The oscillation frequency is 9.2 GHz and the proposed frequency tuning technique is that of "current starvation" whereby the delay that an amplification cell contributes to the overall open-loop delay is changed. A disadvantage of this technique is that it gives rise to variations of the output power with respect to oscillator control voltage.

The use of a cross-coupled transistor pair in a differential amplifier to vary delay in a CMOS ring oscillator is known from B. Razavi "Design of Analog CMOS Integrated Circuits" McGraw-Hill, International Edition, 2001, pages 515 to 518.

The disclosure of each of the above references is specifically incorporated in this application by their citation. The present invention, according to a first aspect, provides an integrated circuit distributed radio frequency (RF) oscillator comprising a semiconductor chip which includes: first and second differential RF transmission lines; coupled in parallel between the first and second transmission lines at spaced-apart positions along the transmission lines, a plurality of differential amplifier cells with adjustable delay; an oscillation feedback link between the first and second transmission lines; and an output buffer connected to one of the first and second transmission lines.

The feedback link typically comprises a pair of metal-insulator-metal (MIM) capacitors forming part of the chip, the first and second differential transmission lines being arranged in series but, also, side-by-side and bent into a loop so that an input end of one of the transmission lines lies adjacent an output end of the other. The capacitors are located between these adjacent ends to interconnect the ends.

It will be understood that, typically, with the transmission lines forming loops, if they are formed in the same layer of the semiconductor chip and lie alongside each other, one transmission line has a longer physical length than the other. In this instance, the transmission lines are constructed such that they have different wave propagation velocities in order that their electrical lengths are substantially equal.

In the preferred oscillator, the series-connected first and second differential transmission lines form a spiral path having neighboring input and output portions arranged side-by-side with one portion inside the other, the amplifier cells being distributed around the spiral and each having a differential input connected to the input portion and a differential output connected to the output portion. In the example described hereinafter, the output portion is inside the input portion, but it is also possible for the reverse to apply. The amplifier cells are arranged such that they constitute substantially radially oriented signal paths which are angularly spaced apart around the spiral. Although the spiral may be curved, it is preferred that the input and output portions each form a respective rectilinear portion of the spiral, each such rectilinear portion having a plurality of sides, typically four sides, with the amplifier cells each being connected to a respective one of the sides of each rectilinear portion. Thus, each side of each rectilinear spiral portion may be at right angles to at least one consecutive side of that rectilinear portion and, with the intermediate sides of the rectilinear spiral portion being at right angles to consecutive sides at either end. Each rectilinear spiral portion side may then run alongside and parallel to a respective side of the other rectilinear spiral portion.

The differential transmission lines, the amplifier cells and the feedback link form an oscillator core with each of the amplifier cells having a differential input coupled to the first transmission line and a differential output coupled to the second transmission line. It is preferred that the output end of the first transmission line, in this case, forms an output of the oscillator core. Such an output may feed an on-chip output buffer having a differential input.

Different transmission line configurations may be used for the differential transmission lines, depending, particularly, on the frequency band in which the oscillator operates. In the preferred embodiment of the invention, each differential transmission line comprises a pair of parallel metal microstrip tracks in a single metal layer of the chip, or the metal layer beneath the substrate. The requirement for balanced variations between high values of odd mode impedances in the transmission lines and low losses at the operation frequency or frequencies affects the choice of structure for the transmission lines. Thus, the backplate may be omitted and the transmission line may be microstrip over substrate. Typically, the transmission line is capacitively loaded by a backplate close to the microstrip tracks in order to lower the propagation velocity and, thereby, to achieve the required phase shift along the transmission lines within a compact structure.

With regard to the capacitive feedback link, this may comprise at least one pair of capacitors, each pair comprising a first pair capacitor interconnecting a first track of one of the differential transmission lines and a first track of the other differential transmission line, and a second capacitor adjacent the first capacitor and interconnecting a second track of the one differential transmission line and a second track of the other differential transmission line. Preferably, the capacitor is isolated from the chip substrate.

The preferred oscillator is a voltage-controlled variable frequency oscillator. Frequency variation is produced by arranging for each of the amplifier cells to constitute a variable delay element, each having a control input for receiving a tuning signal, the delay of the amplifier cell being dependent on a parameter of the tuning signal, e.g. its voltage. It is preferred that each of the differential amplifier cells has a differential control input and a positive feedback circuit for varying the delay. The positive feedback circuit applies a negative resistance load to the amplifier output and, depending on the level of positive feedback, the delay is varied. It is possible to achieve delay variation by apportioning a fixed total d.c. supply current variably between the differential amplifier circuit and a cross-coupled transistor pair as a positive feedback circuit of the amplifier cell, variation in the apportionment being in response to variation of a differential control voltage input. In the preferred embodiment, all of the amplifier cells of the oscillator core are tuned in unison by a single differential voltage control signal.

In order to maintain synchronization of the signals propagating along the differential transmission lines, the d.c. supply current for the differential amplifier circuit of each amplifier cell may consist of a fixed part and a variable part, the fixed part being several times bigger than the sum of the variable supply currents for the differential amplifier circuit and the cross-coupled pair.

The semiconductor chip preferably uses bipolar transistors, e.g. formed using SiGe BiCMOS technology. This technology combines high performance hetero junction bipolar transistors (HBTs) with CMOS digital circuitry. As an alternative, MOSFET transistors using CMOS technology may be used.

Other aspects of the invention, including a method for designing an integrated circuit distributed oscillator, are set out in the claims.

The invention will now be described by way of example with reference to the drawings in which:—

Figure 1:
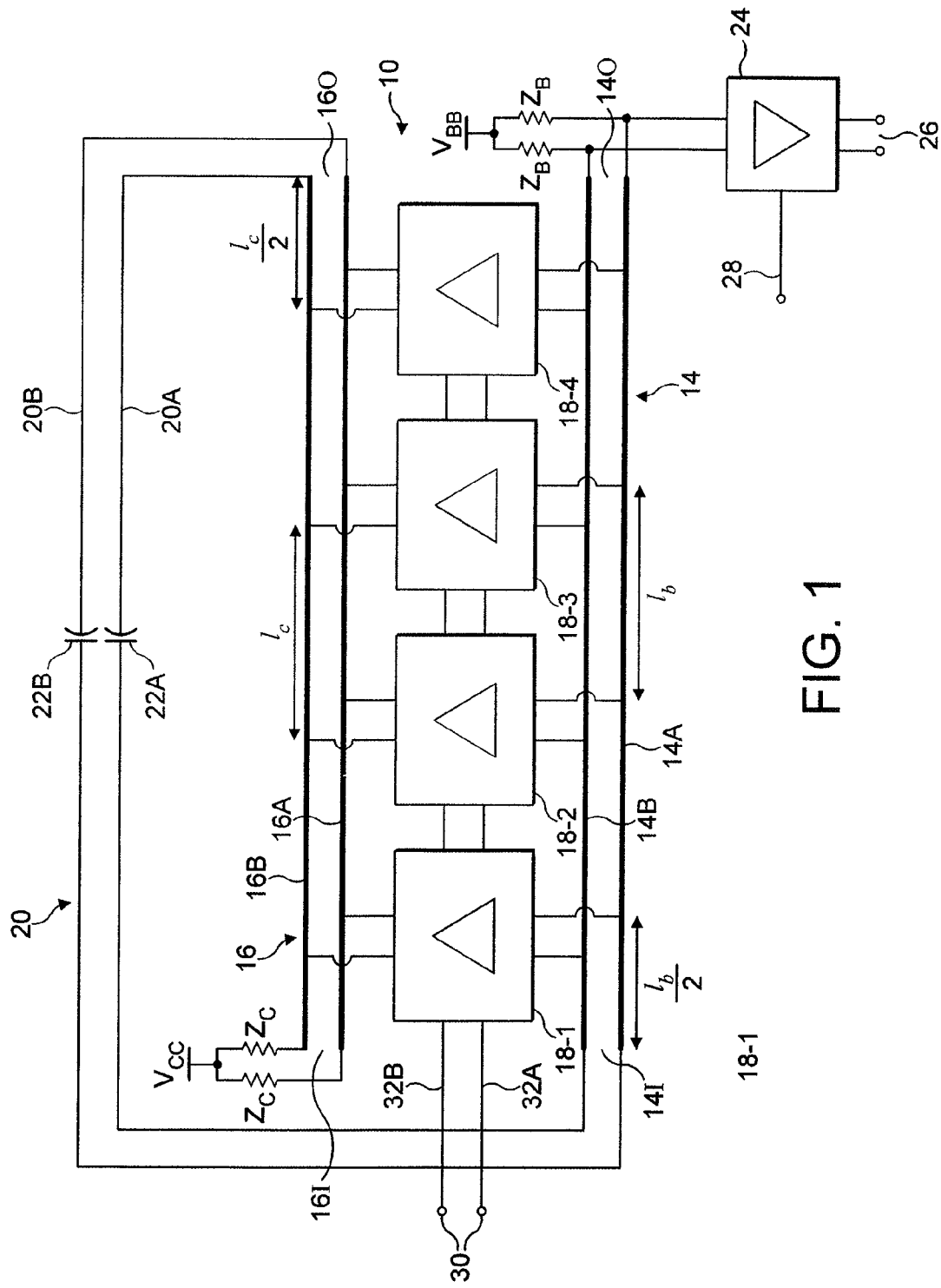
FIG. 1 is a schematic diagram showing an integrated circuit differential distributed oscillator in accordance with the invention.

Referring to FIG. 1, a differential distributed voltage-controlled oscillator (DDVCO) in accordance with the invention comprises an oscillator core 10 having an input differential transmission line 14 and, arranged alongside and parallel to the input transmission line 14, an output differential transmission line 16 having the same electrical length. Each differential transmission line 14, 16 is formed as a pair of conductor tracks 14A, 14B; 16A, 16B which are close to each other, as shown. At equally spaced intervals along the transmission lines 14, 16, there are differential amplifier cells 18-1, 18-2, 18-3, 18-4, each spanning the space between the two differential transmission lines and each having a differential input coupled to the input transmission line 14 and a differential output coupled to the output transmission line 16.

Since, in this embodiment, the amplifier cells use bipolar transistors, and have transistor base connections to the input transmission line 14, this transmission line 14 is called the "differential base line" below. Likewise, since collector connections of the amplifier cell transistors are connected to the output differential transmission line 16, this output transmission line is hereinafter referred to as the "differential collector line". It will be understood that if, instead, CMOS technology is used, the transmission lines can be labeled the differential gate line and differential drain line respectively.

The differential base line has an input end 14I and an output end 14O. Likewise, the differential collector line 16 has an input end 16I and an output end 16O. The spacing between each amplifier cell input connection to the differential base line 14 is $l_b$ along the line 14, with the outermost cells 18-1, 18-4 each being connected to the differential base line 14 at a distance $l_b/2$ from the input end 14I and the output end 14O respectively. Similarly, the separation distances between the connections of the outputs of the amplifier cells to the differential collector line 16 are $l_c$ along the line 16, with the output connections of the outermost amplifier cells 18-1, 18-4 being at a distance $l_c/2$ from the input and output ends 16I, 16O respectively. In practice, although the physical lengths $l_b$ and $l_c$ are different; their electrical lengths are equal, as will be described below.

It will be understood that a differential RF signal at the input end 14I of the differential baseline 14 propagates along the line at a velocity dependent on the characteristics of the line. At each tapping point represented by the connection of the differential input of an amplifier cell 18-1, 18-2, 18-3, 18-4 to the baseline 14, the signal is amplified by the respective amplifier cell and a corresponding output is fed to a respective feed point on the differential collector line 16, the amplified signal then being propagated along the collector line. Each amplifier cell introduces a small delay between its input and its output. The spacing of the cells along the differential base and collector lines is such that, at a required frequency of operation, the output signal of each amplifier cell reinforces the other output signals traveling along the differential collector line 16 from the other amplifier cells. In other words, at the frequency of operation the signals in each transmission line are synchronized. Each line 14, 16, is terminated at a predetermined distance from the amplifier connection nearest the respective end in order that a signal at the amplifier connection is reflected back to that connection with a phase that reinforces the incident signal, i.e. by arranging for the separation of the outermost amplifier cell connections from the respective transmission line ends to be half the separation between consecutive amplifier cell connections on the line.

Each differential transmission line 14, 16 is terminated at one of its ends by a differential pair of resistances $Z_b$, $Z_c$ respectively, each termination also serving to bias the transistors of the amplifier cells 18-1 to 18-4 by their connection to respective voltage sources $V_{BB}$, $V_{CC}$.

Thus far, the structure described is that of a differential distributed amplifier. In order for the circuit to operate as an oscillator, the differential feedback loop 20 interconnects the output end 16O of the differential collector line 16 to the input end 14I of the differential base line. Incorporated in the feedback line 20 is a pair of two coupling capacitances 22A, 22B, each connected in series in the respective differential conductor 20A, 20B of the feedback line 20. For diagrammatic simplicity, the feedback line 20 is shown in FIG. 1 as a loop having considerable length. In practice, as will be described below, the length of the feedback link is negligible compared to the lengths of the differential transmission lines 14, 16.

The feedback link provides positive feedback, leading to oscillation at a frequency at which the signals along the differential transmission lines 14, 16 are synchronized in the manner described above.

The output from the oscillator core is produced at the output end 14O of the differential baseline 14 which is connected to the input of a high-speed differential output buffer 24 which, in turn, has a buffered differential output 26 coupled to output pins (not shown in FIG. 1) of the semiconductor chip containing the DDVCO. Taking the output of the oscillator core from the output end 14O of the differential baseline 14 minimizes the loading on the oscillator core and, thereby, achieves the best open-loop gain/bandwidth product and, consequently, the maximum possible oscillation frequency when the loop is closed.

The capacitors 22A, 22B are MIM capacitors formed on the chip. These are, in relation to the frequency of operation, large AC capacitors, isolated from the substrate and each having a value in the region of 0.7 to 1.0 pF.

The output buffer provides a standard 50 ohm output impedance, and input characteristic impedance equal to the odd-mode impedance of the differential baseline 14 being other than 50 ohms. The output buffer 24 isolates the main oscillator core 10 from succeeding stages of the equipment to which the integrated circuit is connected or from succeeding stages following the output buffer within the integrated circuit (in the case that such stages are embodied in the chip). It is also possible to adjust the output amplitude of the oscillator by adjusting the gain of the output buffer 24 using a gain control input 28.

The frequency of oscillation of the distributed oscillator depends on the round-trip delay produced by the differential transmission lines 14, 16, the amplifier cells 18-1 to 18-4 and the feedback link 20. It follows that the frequency of the oscillator 20 can be tuned by altering the delay component introduced by the amplifier cells, each of which has a differential control input connected to a differential tuning input 30 on two pins of the integrated circuit, the connection being made by control lines 32A, 32B running between each amplifier cell and the tuning input 30. The manner in which the delay of the amplifier cells is varied will be described below.

Figure 2:
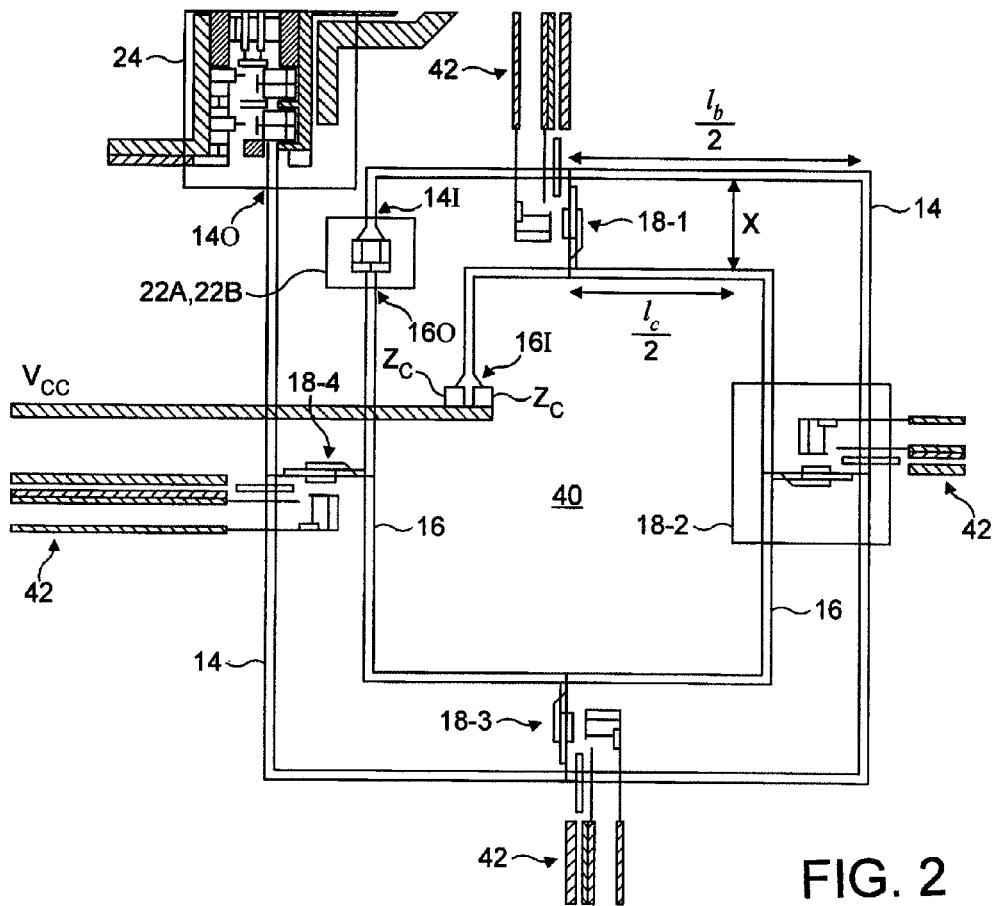
FIG. 2 is a photograph of part of a semiconductor chip containing an oscillator core of the oscillator of FIG. 1.
Figure 4:
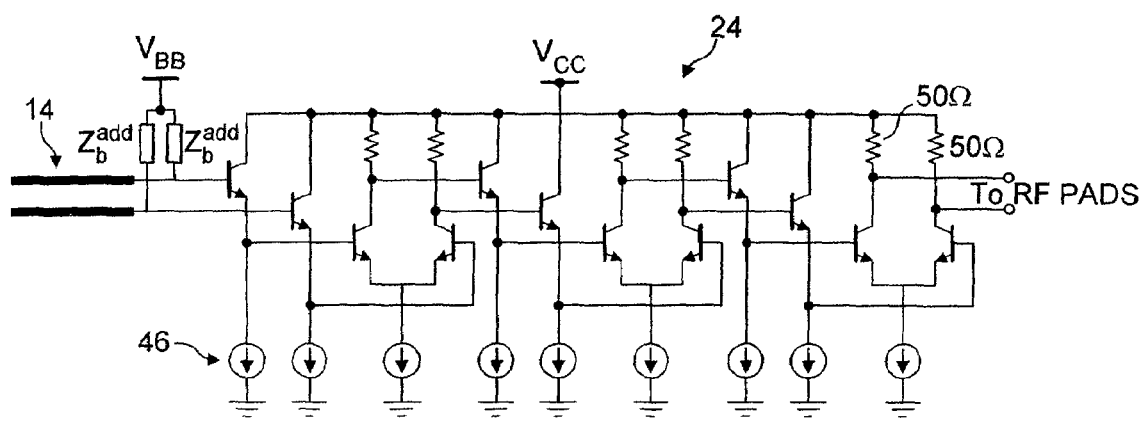
FIG. 4 is a simplified circuit diagram of an output buffer.

As explained above, the positioning of the oscillator components in the diagram of FIG. 1 is not fully representative of their actual position on the chip, for reasons of clarity. The actual layout of the oscillator core on the chip is shown in FIG. 2. Referring to FIG. 2, the arrangement of the differential transmission lines 14, 16 as a series-connected combination, with the differential base line 14 extending alongside the differential collector line 16, is achieved by forming the transmission lines 14, 16 as a single rectilinear spiral. The spiral has an output portion (collector line 16) in the sense that it is connected to the outputs of the amplifier cells 18-1-18-4 which output portion lies inside an input portion (the differential baseline 14) connected to the inputs of the amplifier cells 18-1, 18-4. The inner end of the spiral forms the input end 16I of the differential collector line, where the supply $V_{cc}$ is coupled to the paired tracks of the collector line 16 by respective large area resistors $Z_c$. From the input end 16I, the differential collector line 16 follows a four-sided rectilinear spiral path ending at the output end 16O of the differential collector line where the line is connected to the MIM capacitors 22A, 22B. These provide an a.c. link to the input end 14I of the differential baseline which continues the spiral path. The baseline 14 also follows a four-sided rectilinear path each side of which lies outside and parallel to respective sides of the spiral output portion and extends in a clockwise direction to the output end 14O of the differential baseline 14. In this embodiment, each of the input and output portions extends a full 360° around the spiral path, each differential transmission line comprising a pair of tracks in a common metal layer of the chip. Formed at the output end 14O of the differential baseline is the output buffer 24. (This area of the chip also contains the terminating resistances $Z_b$ which are not labeled in FIG. 2, but which are shown in FIGS. 1 and 4.)

It will be understood that this looped spiral configuration of the differential transmission lines 14, 16 allows the output end of the differential collector line 16 to lie immediately adjacent the input end 14I of the differential baseline 14 in order that they can be directly interconnected by the capacitors 22A, 22B without intermediate lines. Since the two transmission lines 14, 16 lie respectively one inside the other, their physical lengths are different. However, their electrical lengths are substantially identical. For this reason, the tracks of the respective lines 14, 16 are differently dimensioned. In this example, the characteristic impedance of the differential collector line 16 is approximately 10 ohms lower than that of the differential baseline 14. The lines are low loss lines in order to achieve high oscillation amplitudes and, as stated above, are formed as differential microstrip transmission lines with the backplate of the chip forming a ground reference. Losses are controllable via the spacing of the signal lines. Low odd-mode characteristic impedances are exhibited by the transmission lines owing to a short vertical distance between comparatively wide signal lines and the backplate (approximately 2.5 μm). It will be noted that consecutive sides of the rectilinear portions of the spiral are at 90° to each other. The transmission line bending does not substantially affect wave propagation since the dimensions of the discontinuities that they represent are negligible compared to the operating wavelength on the chip. One result of the spiral routing of the transmission lines is that their inner and outer tracks are imbalanced. This imbalance is compensated by 90° bending of the inner tracks at each corner between the rectilinear sides and a dual 45° bending of the outer tracks at the corners.

With regard to the terminating resistors $Z_c$ at the input end 16I of the differential collector line 16 (which are in the reverse direction with respect to signal flow in the line 16), emphasis is put on their connection with the power supply.

The first metal layer of the chip is used for minimizing the coupling capacitance between this metal layer and the differential transmission line.

On the basis that a central region 40 of the spiral can be identified, the four amplifier cells 18-1-18-4 represent substantially radially oriented signal paths extending between the input and output portions (the differential base line 14 and the differential collector line 16) of the spiral path. They are uniformly spaced along the lines 14, 16 and, therefore, angularly spaced apart around the spiral path. Each cell is located at an intermediate position along a respective side of the four-sided rectilinear portion of the spiral path. The first and the last amplifier cells 18-1, 18-4 are connected to the base transmission line 14 at a distance of $l_b/2$ along the line from, respectively, adjacent end 14I and the output end 14O where it is connected to the output buffer 24. The separation between each amplifier cell and the adjacent corners of the differential baseline 14 is the same distance, $l_b/2$ in each case, as shown in FIG. 2, the spacing between consecutive amplifier cell connections to the differential base line 14 being $l_b$ as described above with reference to FIG. 1. Similarly, with regard to the differential collector line 16, the first amplifier cell 18-1 is connected to this line at a distance $l_c/2$ from the input end 16I of the line 16 and the last amplifier cell 18-4 is connected to the collector line at a distance $l_c/2$ from the output end 16O of the differential collector line 16. Each cell connection to the differential collector line 16 is at a distance $l_c/2$ from the adjacent corners of the line 16, the intercell spacing along the differential collector line 16 being $l_c$, again as described above with reference to FIG. 1. The radial separation X between the two portions of the spiral path, i.e. between the differential collector line 16 and the differential baseline 14 is given by:

$$X = \frac{l_b}{2} - \frac{l_c}{2}$$

This distance X also represents the length of the signal path represented by each amplifier cell 18-1-18-4.

In order to minimize unwanted coupling and interference, connections 42 to the amplifier cells 18-1-18-4 are also oriented radially with respect to the spiral central region. In particular, they are oriented perpendicularly to the respective sides of the spiraled transmission lines 14, 16, running outwardly away from the spiral path. This applies particularly to the control lines 32A, 32B (see FIG. 1) but, in this instance, also applies to ground and biasing connections.

Frequency tuning of the oscillator is performed by varying the overall delay of the equivalent open-loop circuit, which in turn leads to a change of the oscillation frequency. In the preferred embodiment of the invention, this variation is achieved using delay variation by positive feedback. More particularly, in the preferred oscillator the overall delay is adjusted by changing the delay that the amplifier cells 18-1-18-4 contribute.

Figure 3:
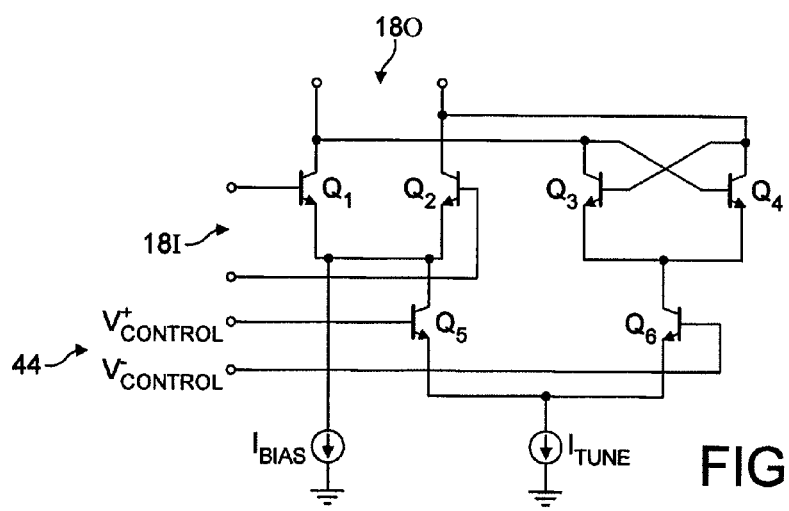
FIG. 3 is a simplified circuit diagram of a differential amplifier cell, a plurality of such cells forming part of the distributed oscillator of FIG. 1.

Referring to FIG. 3, which is a simplified circuit diagram of each amplifier cell 18-1-18-4, the amplifier cell comprises a differential amplifier formed as a long-tailed transistor pair $Q_1$, $Q_2$ with current biasing from two current sources $I_{BIAS}$, $I_{TUNE}$. The base connections of the transistors Q1, Q2 form the differential input 18I of the cell, and their collector connections form the differential output 18O which, as seen in FIG. 1, is coupled directly to the differential collector line 16 having an odd mode characteristic impedance $Z_c^{odd}$. Coupled in parallel across the differential output 18O is a cross-coupled transistor pair $Q_3$, $Q_4$, each transistor $Q_3$, $Q_4$ having its base connected to the collector of the other transistor of the pair, the collectors being coupled to a respective one of the output lines of the differential output 18O. The cross-coupled pair $Q_3$, $Q_4$ is also current biased from the current source $I_{TUNE}$. Thus, the collectors of both the differential amplifier transistors $Q_1$, $Q_2$ and the cross-coupled transistors $Q_3$, $Q_4$ have as their load the differential transmission line 16 (FIG. 1) with odd mode characteristic impedance $Z_c^{odd}$. The cross-coupled transistor pair $Q_3$, $Q_4$ exhibits a negative resistance $-1/g_{m3,4}$. This resistance is inversely proportional to the component of the tail current, $I_{TUNE}$, that is drawn from the cross-coupled pair.

It will be seen that the tail current of the differential amplifier long-tailed pair $Q_1$, $Q_2$ is the sum of the fixed current $I_{BIAS}$ of a first constant current source and a variable component of the fixed current $I_{TUNE}$ of a second constant current source. The remainder of the current $I_{TUNE}$ is drawn by the cross-coupled pair $Q_3$, $Q_4$, the sharing of the current $I_{TUNE}$ of the second constant current source being controlled by a differential pair of transistors $Q_5$, $Q_6$ having their emitter connections linked together and to the second constant current source, and their base connections forming a differential control input 44. This control input 44 of each amplifier cell is coupled to a common differential tuning input 30 of the oscillator (FIG. 1). The differential tuning voltage ($V^+_{control}$, $V^-_{control}$) diverts or steers current from the differential amplifier $Q_1$, $Q_2$ to the cross-coupled pair $Q_3$, $Q_4$, altering the negative resistance of the latter up to $-1/g_{m,max}$, where $g_{m,max}$ is the maximum transconductance of the transistors $Q_3$, $Q_4$ given by the relationship $$g_{m,max} = \frac{q}{kT} I_{TUNE},$$

where $I_{TUNE}$ is the tail current of the second constant current source. This has as a result that the overall delay of the differential cell changes according to the differential control voltage but the current that contributes to the differential voltage swing remains constant, i.e. $I_{SWING} = I_{BIAS} + I_{TUNE}$.

Regarding the ratio between the tail currents $I_{TUNE}$ and $I_{BIAS}$ of the constant current sources, it should be noted that a large ratio value $I_{BIAS}/I_{TUNE}$ results in a wide tuning frequency range, but care is needed to avoid a significant deviation of the differential amplifier operating point. Such deviation can result in line synchronization errors that can lead to imperfect superposition of the propagating waves on the differential collector line or to deviations with respect to the odd mode characteristics of the loaded differential collector line. Such effects lead, in turn, to an increase in phase noise due to impedance mismatching between the terminating resistors and the transmission lines, and may cause lack of oscillation. For this reason, the ratio $I_{BIAS}/I_{TUNE}$ is chosen so that it allows tolerable line synchronization errors. Line synchronization is also affected by the length of the emitters of the cross-coupled transistor pair $Q_3$, $Q_4$. These lengths are kept small, the ratio of the emitter lengths of the differential amplifier transistor pair $Q_1$, $Q_2$ with respect to those of the cross-coupled pair $Q_3$, $Q_4$ being at least 5:1, and typically in the region of 7.5:1. In the specific implementation of the oscillator (in 0.35 µm SiGe BiCMOS technology) the emitter lengths are given by: $Le_{1,2}/Le_{3,4} = 6$ µm/0.8 µm and the biasing and tuning currents are given by $I_{BIAS}/I_{TUNE} = 2.3$ mA/0.3 mA, i.e. also with a ratio in the region of 7.5:1.

Depriving a differential amplifier long-tailed pair of current to alter the delay of the amplifier, a technique known as current starvation, has, in the past, resulted in a large output power deviation across the operating frequency range. This is due to the fact that the tail current of a long-tailed pair differential amplifier varies the control voltage having as a consequence, that the differential voltage swing is not constant. The positive feedback technique, applied to each of the amplifier cells 18-1-18-4 (FIG. 1) achieves substantially constant output power across the tuning range of the oscillator. The preferred amplifier cell is based on bipolar transistors (BJTs), but the circuit structure is similar for implementations based on MOSFET transistors.

Referring to FIG. 4, the output buffer 24 is a multistage circuit implemented with BJT transistors. (A similar structure may be used for implementations based on MOSFET transistors.) The differential input impedance of the buffer is equal to the differential impedance of the loaded differential base line 14 of the oscillator core. It has a differential output with a differential output impedance of 100 ohms. There is high isolation between differential input and output, and the output power is equal to the output power of the oscillator core 10 (FIG. 1). This last property is achieved by reducing the bias currents of current sources 46 at the various differential amplification stages.

The resistors used at the collectors of the differential amplifiers of the oscillator should be selected in such a way that the output buffer amplifies and limits the signal amplitude.

The current sources 46 of the buffer differential amplifiers are implemented with HBT transistors and a polysilicon resistor (not shown) connected between emitter and ground in each case. The base voltage of this HBT transistor may be controlled by an adjustable voltage reference circuit structure via the buffer control input 28 (FIG. 1) or a fixed voltage reference, e.g. a voltage bandgap circuit, may be used.

Figure 5:
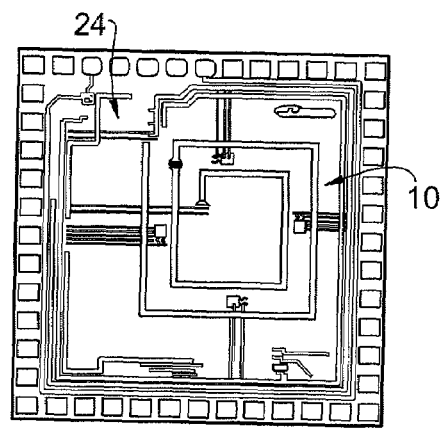
FIG. 5 is a photographic representation of the complete integrated circuit, part of which is shown in FIG. 4.

The complete layout of the preferred integrated circuit oscillator in accordance with the inventive is shown in FIG. 5. The chip is a low cost SiGe BiCMOS element providing switching frequencies in the order of 60 GHz. BiCMOS technology is available as 0.35 µm technology from Austria MicroSystems (AMS) using HBT transistors. In this example, the dimensions of the oscillator core 10 are 0.9 mm by 0.9 mm, the surrounding space being occupied by the output buffer 24, supply components, and control connections.

The design of the integrated differential distributed VCO requires the consideration of a number of physical constraints that layout restrictions, full integration into the same silicon device, and the electromagnetic behavior of the interconnections and the transmission lines, impose. These restrictions are associated with the corresponding circuit parameters to specify the range of their possible values and, indeed, to define them accurately. If these are not taken into account at the circuit design level of the oscillator, it is possible that a non-feasible solution is reached. To determine appropriate values in required implementations, an analytical design methodology may be used. This methodology is described below for an implementation based on BJTs, but the process is similar for implementations based on MOSFETs. More specifically, the parameters that need to be taken into consideration are the following:

1. The distance X (FIG. 2), where $$X = \frac{l_b}{2} - \frac{l_c}{2},$$

which relates the lengths of the transmission lines with the size of the amplification cell of each stage. This is considered at the circuit level design stage, since the amplifier cells should fit between the differential transmission lines 14, 16.

2. The emitter length $L_e$ of the SiGe HBTs which are used in the differential amplifier of each amplifier cell stage (the transistors $Q_1$, $Q_2$ in FIG. 3) the conductors widths $W_b$, $W_c$ of the base and collector transmission lines 14, 16, the associated cell separations $l_b$, $l_c$, and the spacing ($S_b$, $S_c$) between the transmission line conductors.

The values of the preceding parameters are limited by the design rules of the specific technology employed, as well as by its electrical performance in the worst case. For example, regarding the physical parameters, the conductor widths and spacings $W_c$, $W_b$, $S_c$, $S_b$ of the transmission lines 14, 16, their minimum values are defined by the specific technology used for the oscillator implementation and their maximum values are calculated by taking into consideration the lowest value of the odd mode characteristic impedance that the "unloaded" transmission lines can have (e.g. 50 ohms). The methodology that is followed for a specified set of design parameters is now described with reference to in FIG. 6.

Figure 6:
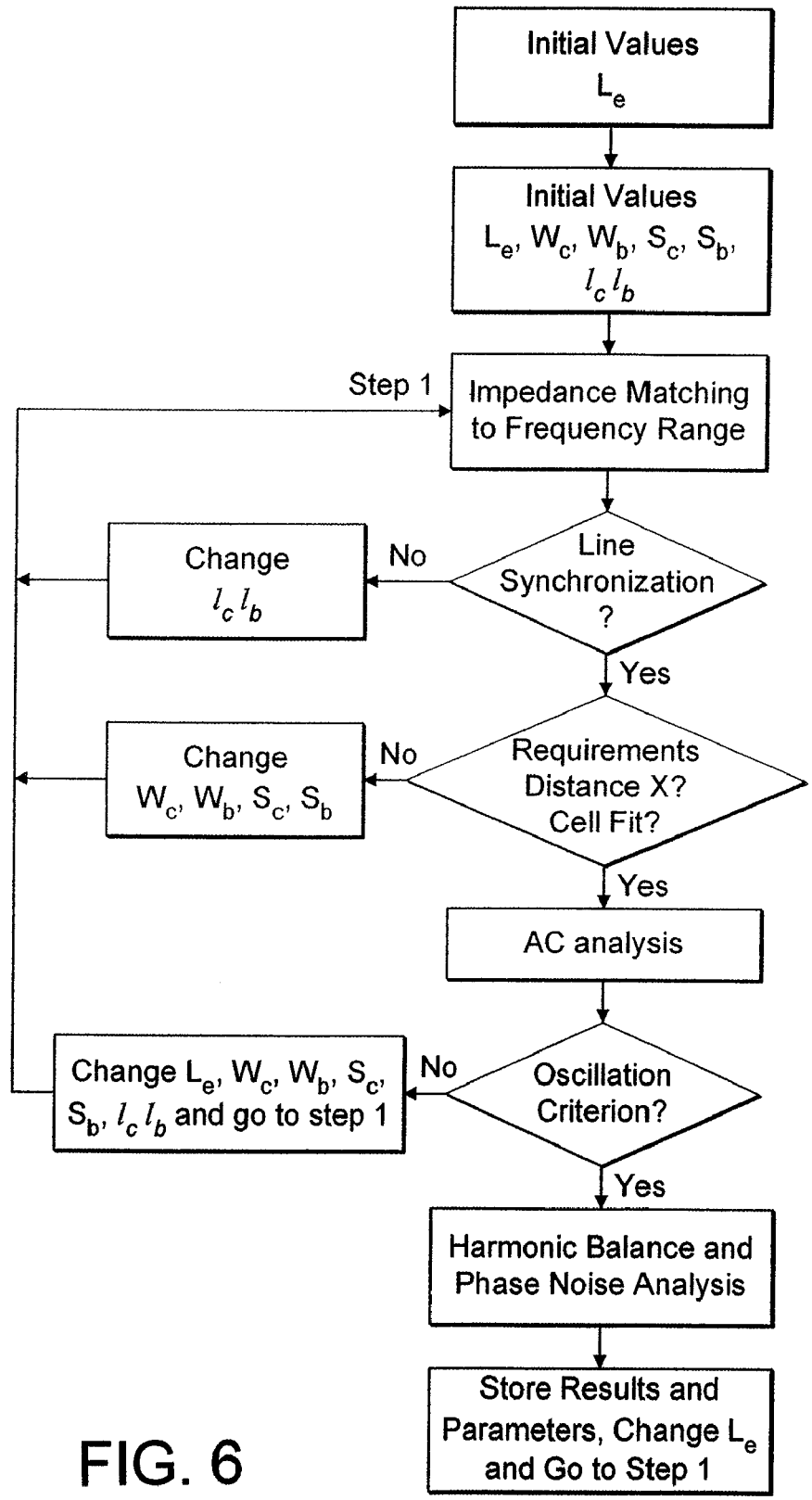
FIG. 6 is a flow diagram illustrating a design process.

Referring to FIG. 6, the procedure starts with the impedance matching of the "loaded" differential transmission lines over the desired frequency range of oscillation. This is realized by taking into consideration the differential mode of operation of the open-loop equivalent circuit, where the mixed mode S-parameter theory is applied and a threshold value has been specified for the reflection coefficients at the four ends 14I, 14O, 16I, 16O of the transmission lines. The next step includes the verification of whether the line synchronization condition (for oscillation) is valid for the specified frequency range of interest according to a predefined maximum relative error. There follows a check on whether the physical requirements for the placement of the amplification cell are in accordance with the distance parameter X (FIG. 2). Subsequently, AC analysis is performed to check whether the open-loop oscillation condition is satisfied and, upon confirmation, a harmonic balance and phase noise analysis is performed with respect to the differential tuning voltage of the oscillator frequency.

This procedure is performed by the designer for a specific current ratio $I_{BIAS}/I_{TUNE}$. If, after the harmonic balance step, no oscillation is achieved in the desired frequency range, the ratio is increased according to the considerations presented above in the description of the amplifier cell, and the whole procedure is repeated until a valid solution is reached.

In conclusion, the integrated differential distributed oscillator differentiates and exhibits certain advantages over the existing relevant distributed designs and implementations in the following points:
1. It is totally monolithic in the sense that all the oscillator components are integrated on the same IC (on-chip). In contrast to relevant implementations that have been presented in the literature in which the connection of the output and input is always performed off-chip, the implementation described here closes the required loop between input and output with the use of MIM capacitors. The advantages of this (on-chip) connection are that the number of pins of the oscillator IC is drastically reduced, there is no noise coupling with external elements, and it does not impose additional workload to the oscillator user.
2. A new frequency tuning technique has been employed, known as delay variation with positive feedback technique. Advantages of this technique are the linear frequency variation and the fact that constant output voltage is achieved with respect to the differential control voltage.
3. A high speed output buffer is provided in the same IC (on-chip), aiming at the full isolation of the oscillator circuitry from possible external variations, like e.g. impedance mismatching.
4. The output signal of the main oscillator subcircuit is taken from the end of the differential base line, and not from the collector as is the case for other similar implementations—and is fed to the input of the output buffer subcircuit, with the result that the maximum oscillation frequency is achieved.
5. A detailed and rigorous methodology for the design of the presented oscillator has been developed by the applicant to optimize the oscillator characteristics and perform its optimal implementation according to the physical constraints imposed.

Figure 7:
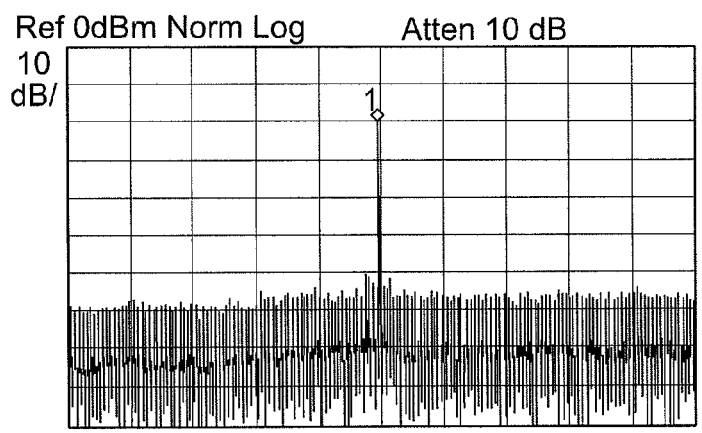
FIG. 7 is a diagram showing the output power frequency spectrum of the oscillator.

The center oscillation frequency of the preferred integrated circuit oscillator is 14.25 GHz, as shown in FIG. 7 which depicts the output power spectrum of the oscillator over a 5 GHz range.

Figure 8:
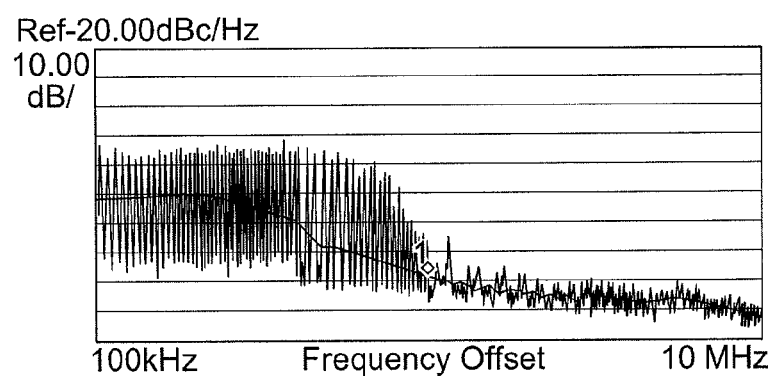
FIG. 8 is a phase noise frequency spectrum produced by the oscillator.

Referring to FIG. 8, the phase noise is −98 dBc/Hz at 1 MHz offset from the oscillation carrier of 14.25 GHz.

Figure 9:
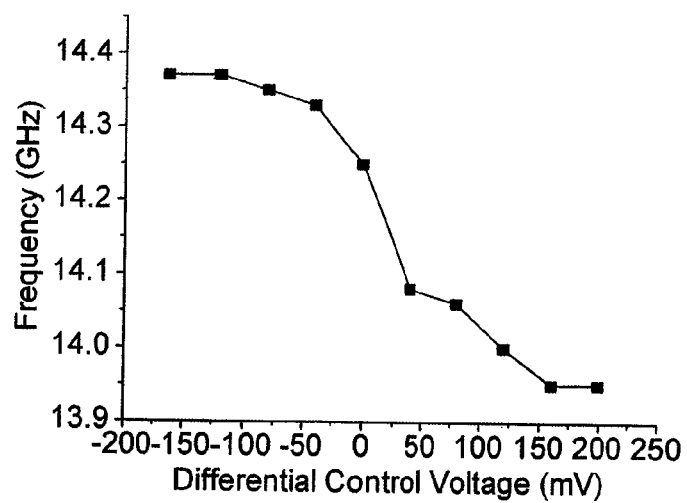
FIG. 9 is a graph showing a frequency tuning characteristic.

The tuning range of the oscillation frequency of the preferred oscillator using the amplifier cell delay variation described above is 420 MHz, with the oscillation frequency ranging between 13.95 GHz-14.37 GHz, (i.e. in the region of three percent of the center frequency) as shown in FIG. 9 which is a plot of the oscillation frequency versus the differential control voltage. The measured output power is −17.5 dBm and the total power consumption of the device is 138.1 mW, two power supplies having been used at 3.2 and 4.2 volts respectively.

The circuit has been designed in such a way that the feedback loop closes with the use of on-chip MIM capacitors, allowing for reduction of the oscillator pins as well as for reduced coupling noise with off-chip elements. It employs a frequency tuning technique which ensures linear frequency variation and constant output voltage with respect to the differential control voltage, a fact which allows for a significant degree of isolation of the oscillator from external interference, and achieves higher operation frequency as well as lower noise levels compared with lumped oscillator circuits implemented in the same silicon technology processes. This oscillator is used in complex integrated circuits for communication applications.

The invention has particular application in the areas of high speed communication, such as optical communications and microwave links where the use of oscillators operating at very high frequencies is required. Indicatively, such an oscillator may be used in a PLL (Phase Locked Loop) e.g. forming part of a Serializer/Deserializer device for optical communication applications with 10 GHz line rate.

The invention claimed is:

1. A method of modeling a monolithic distributed VCO to operate at a given frequency of oscillation, the VCO model having a spacing topology defined by an input differential RF transmission line pair series-disposed so as to form a rectilinear spiral relative to an output differential RF transmission line pair spaced a predetermined (X) distance apart and defined by associated conductor widths and spacings $W_b$, $W_c$, $S_b$, $S_c$ and connected at a common end thereof to a pair of MIM capacitors, and a plurality of differential amplifier cells distributed along the rectilinear spiral and separated a first distance $l_b$ apart relative to the length of the input differential RF transmission line and a second distance $l_c$ apart relative to the length of the output differential RF transmission line, the method comprising:
   selecting values for X, $W_b$, $W_c$, $S_b$, $S_c$, $l_b$, and $l_c$; and
   identifying when the selected values cause the VCO model to oscillate at a desired frequency range.

2. The method of claim 1, further comprising performing at least one of harmonic balance and phase noise analysis on the VCO model to determine that the selected values meet oscillation criterion.

3. The method of claim 1, wherein the desired frequency range is a range in excess of 1 GHz.

4. An integrated circuit comprising:
   a distributed voltage controlled oscillator (VCO), wherein a frequency of oscillation of the VCO is defined by a spacing topology of:
   an input differential RF transmission line pair (14) series-disposed so as to form a rectilinear spiral relative to an output differential RF transmission line pair (16) spaced a predetermined distance apart and defined by associated conductor widths and spacings $W_b$, $W_c$, $S_b$, $S_b$, and connected at a common end thereof to a pair of MIM capacitors, and a plurality of differential amplifier cells (18-1, 18-2, 18-3, 18-4) distributed along the rectilinear spiral and separated a first distance $l_b$ apart relative to the length of the input differential RF transmission line and a second distance $l_c$ apart relative to the length of the output differential RF transmission line, each differential amplifier cell is a variable delay element and includes a voltage-controlled input to fine tune and adjust the frequency of oscillation in a highly linear manner during operation of the VCO.

5. The integrated circuit of claim 4, wherein each of the differential amplifier cells provides delay variation by positive feedback.

6. The integrated circuit of claim 4, wherein each of the differential amplifier cells includes:
 a circuit pair of differential output lines, each coupled to a respective conductor of one of the differential RF transmission lines;
 a cross-coupled transistor pair having a pair of output terminals each of which is coupled to a respective one of the differential RF transmission lines; and
 a current apportioning circuit to vary the ratio of dc supply currents drawn by the circuit pair and the cross-coupled transistor pair respectively in response to a tuning signal being received at the voltage-controlled input.

7. The integrated circuit of claim 6, wherein the current apportioning circuit is a pair of transistors having a common tail connection to a constant current source and being coupled respectively to the circuit pair and the cross-coupled transistor pair, the voltage-controlled input being a differential input comprised of control lines coupled to the pair of transistors.

8. The integrated circuit of claim 4, further comprising an output buffer coupled to the end of the input differential RF transmission line opposite to the end coupled to the MIM capacitors, the output buffer providing a desired gain and isolation.

9. A radio frequency communication system, comprising:
 a VCO having an operating frequency range in excess of 1 GHz, the frequency of oscillation of which is defined by a spacing topology of:
 an input differential RF transmission line pair (14) series-disposed so as to form a rectilinear spiral relative an output differential RF transmission line pair (16) spaced a predetermined distance apart and defined by associated conductor widths and spacings Wb, Wc, Sb, Sc, and connected at a common end thereof to a pair of MIM capacitors, and a plurality of differential amplifier cells (18-1, 18-2, 18-3, 18-4) distributed along the rectilinear spiral separated a first distance $l_b$ apart relative to the length of the input differential RF transmission line pair and a second distance $l_c$ apart relative to the length of the output differential RF transmission line pair, each differential amplifier cell is a variable delay element and includes a voltage-controlled input to fine-tune adjust the frequency of oscillation in a highly linear manner during operation of the VCO.

\* \* \* \* \*